United States Patent [19]

Ahne et al.

[11] 4,397,999
[45] Aug. 9, 1983

[54] POLYIMIDAZOLE AND POLYIMIDAZOPYRROLONE PRECURSOR STAGES AND THE PREPARATION THEREOF

[75] Inventors: Hellmut Ahne, Röttenbach; Eberhard Kühn, Hemhofen; Roland Rubner, Röttenbach, all of Fed. Rep. of Germany

[73] Assignee: Siemens Aktiengesellschaft, Berlin & Munich, Fed. Rep. of Germany

[21] Appl. No.: 179,455

[22] Filed: Aug. 19, 1980

[30] Foreign Application Priority Data

Aug. 21, 1979 [DE] Fed. Rep. of Germany ....... 2933819

[51] Int. Cl.³ .............................................. C08G 69/48
[52] U.S. Cl. .................................. 525/426; 428/411; 428/413; 428/474.4; 525/430; 525/435; 528/341; 528/342; 528/345; 528/353
[58] Field of Search ...................... 525/426, 430, 435; 528/341, 342, 345, 353

[56] References Cited

U.S. PATENT DOCUMENTS 3,338,985  8/1967  Magat et al. ........................ 525/426
3,483,105 12/1969  D'Alelio ............................. 525/426
3,957,512  5/1976  Kleeberg et al. .................... 528/341
3,988,287 10/1976  Inokuchi et al. .................... 525/426
4,026,904  5/1977  D'Alelio ............................. 525/426

OTHER PUBLICATIONS

Hackh's Chemical Dictionary, Fourth Edition, p. 250.
The Naming and Indexing of Chemical Compounds from Chemical Abstracts, vol. 56, pp. 46n, 47n, 48n, 57n, 58n.
Noller–Chemistry of Organic Compounds, Second Edition, p. 139.

Primary Examiner—Harold D. Anderson
Attorney, Agent, or Firm—Kenyon & Kenyon

[57] ABSTRACT

The present invention relates to oligomeric and/or polymeric precursor stages of polyimidazoles and polyimidazopyrrolones, as well as to a method for preparing these new precursor stages. The invention provides addition products of olefinically unsaturated monoepoxides on amino group-containing polycondensation products of aromatic and/or heterocyclic tetraamino compounds with dicarboxylic-acid chlorides or esters or on amino group-containing polyaddition products of the tetraamino compounds and tetracarboxylic-acid dianhydrides. The radiation-reactive precursor stages according to the invention are suited, for example, for the preparation of highly heat-resistant relief structures.

5 Claims, No Drawings

POLYIMIDAZOLE AND POLYIMIDAZOPYRROLONE PRECURSOR STAGES AND THE PREPARATION THEREOF

BACKGROUND OF THE INVENTION

The present invention relates to oligomeric and/or polymeric precursor stages of polyimidazoles and polyimidazopyrrolones as well as to a method for preparing these precursor stages.

Precursor stages of polymers are known, for example, from German Pat. No. 2 308 830 and its corresponding U.S. Pat. No. 3,957,512. These polymer precursor stages are polyaddition or polycondensation products of polyfunctional carbocyclic or heterocyclic compounds carrying radiation-sensitive radicals with diamines, diisocyanates, bis-acid chlorides or dicarboxylic acids. The compounds carrying radiation-sensitive radicals contain two carboxyl, carboxylic-acid chloride, amino, isocyanate or hydroxyl groups suitable for addition or condensation reactions and, partly, in ortho- or peri-position thereto, radiation-reactive groups bound to carboxyl groups in ester-fashion, and the diamines, diisocyanates, bis-acid chlorides and dicarboxylic acids to be reacted with these compounds have at least one cyclic structure element.

The known polymer precursor stages serve for the preparation of protective and insulating layers as well as of relief structures of highly heat-resistant polymers, into which they are converted through exposure and, optionally, through subsequent annealing. In this manner, polymers of the following classes of materials particularly are obtained: polyimides, polyamidimides, polyester imides, poly-1,3-quinazoline-2,6-diones, polyisoindoloquinazoline diones, poly-1,3-oxazine-6-ones and polybenz-1,3-oxazine-2,4-diones.

SUMMARY OF THE INVENTION

It is an object of the present invention to provide new polymer precursor stages which enlarge the spectrum of starting materials for the preparation of relief structures as well as of protective and insulating films. In particular, radiation-reactive polyimidazole and polyimidazopyrrolone precursor stages are to be provided.

According to the present invention, this and other objects are achieved by the provision that the precursor stages comprise addition products of olefinically unsaturated monoepoxides on amino group-containing polycondensation products of aromatic and/or heterocyclic tetraamino compounds with dicarboxylic-acid chlorides or esters, or an amino group-containing poly-addition products of the tetramino compounds and tetracarboxylic-acid dianhdyrides.

Radiation-reactive polyimidazole and polyimidazopyrrolone precursor stages were not known prior to this invention. The compounds according to the present invention exhibit this property and they can, therefore, be cross-linked by radiation and be converted in the process into highly heat-resistant polymers with excellent properties (see in this connection the concurrently-filed U.S. Patent Application "Method For The Preparation Of Highly Heat-Resistant Relief Structures", Ser. No. 179,463, now U.S. Pat. No. 4,332,882. Besides their photo structurability, the precursor stages according to the present invention also are distinguished by the fact that they are soluble in organic solvents and, in part, also in aqueous-alkaline media.

The polyimidazole precursor stages according to the present invention exhibit in general the following structure (1) or (2), and the polyimidazopyrrolone precursor stages exhibit the structure (3) or (4):

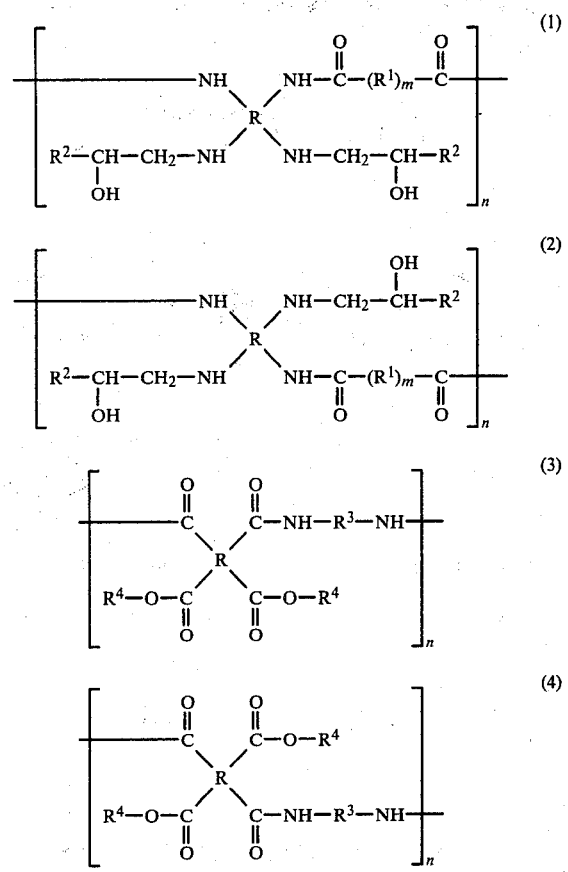

In the Formulas (1) to (4) for the polyimidazole and polyimidazopyrrolone precursor stages, n is an integral number from 2 to about 100 and m=0 or 1.

The following applies to R, $R^1$, $R^2$, $R^3$ and $R^4$:

R is an optionally halogenated, at least partially aromatic and/or heterocyclic tetravalent, i.e., tetrafunctional, radical, in which two valences always are arranged adjacent to each other; if the radical R has several aromatic and/or heterocyclic structure elements, the valence pairs are located at respective end-position structure elements of this type;

$R^1$ is an optionally halogenated, divalent, i.e., difunctional, radical of aliphatic and/or cycloaliphatic structure, optionally having hetero atoms, and/or of aromatic and/or heterocyclic structure;

$R^2$ is an olefinically unsaturated radical, particularly an optionally substituted, (meth)acryl ester-containing group;

$R^3$ is an at least partially aromatic and/or heterocyclic divalent, i.e, difunctional, radical in which an amino group is arranged adjacent to at least one of the two valences; if $R^3$ has several aromatic and/or heterocyclic structure elements, then the free valences each are located at end-position structure elements of this type; and $R^4$ is hydrogen or an $R^2$ substituted hydroxy alkyl radical.

The radicals R, $R^1$, $R^2$, $R^3$ and $R^4$ have in particular the following meaning:

R =

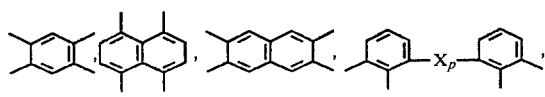

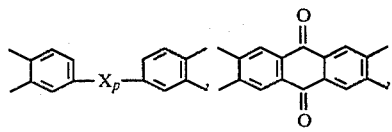

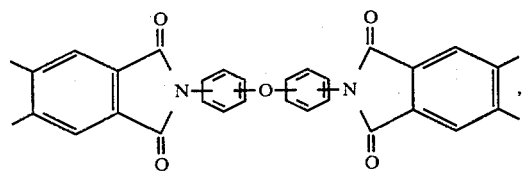

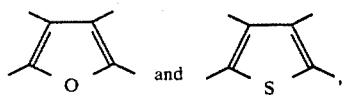

where p=0 or 1, and X stands for one of the following radicals:

X =

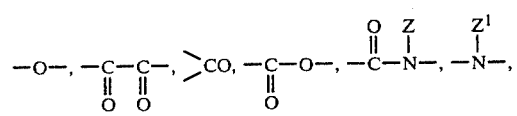

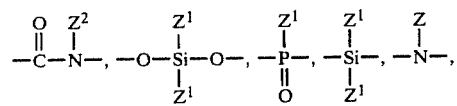

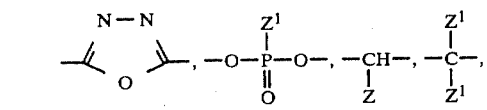

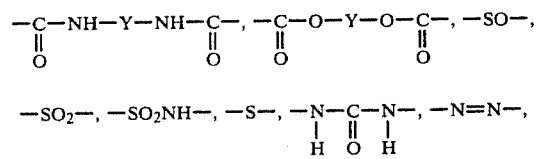

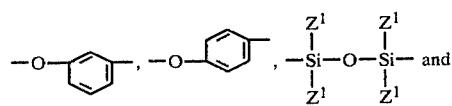

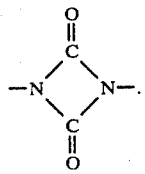

The following applies to the other radicals:
Y =

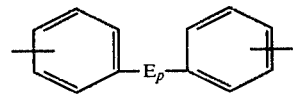

with o = 2 to 10, and

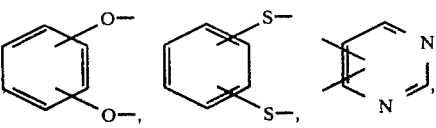

with p = 0 or 1
Z = H or alkyl with 1 to 6 carbon atoms,
$Z^1$ = alkyl with 1 to 10 carbon atoms or aryl,
$Z^2$ = aryl or heteroaryl, and
E =

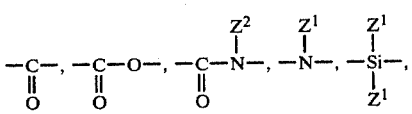

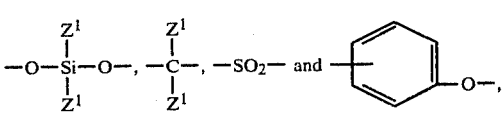

where q = 2 to 14 and r = 2 to 18, and $Z^1$ and $Z^2$ are as defined above.

$R^1 =$

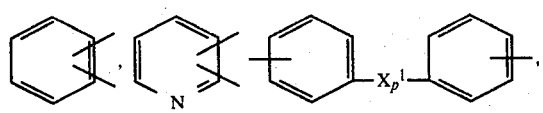

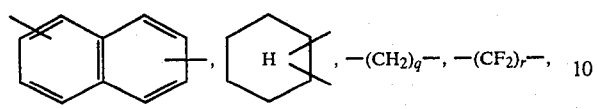

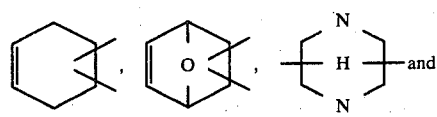

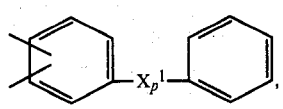

where p=0 or 1, q=2 to 14 and r=2 to 18.
$X^1 =$

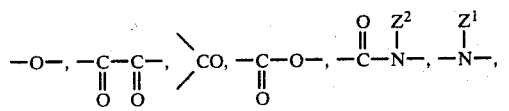

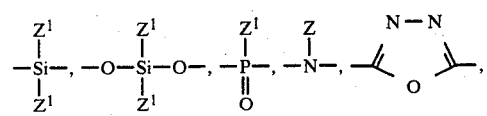

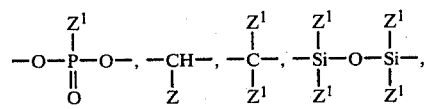

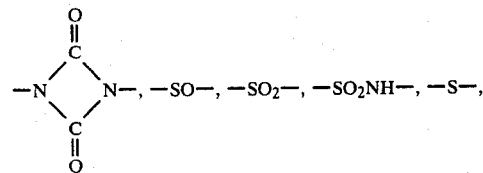

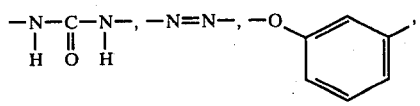

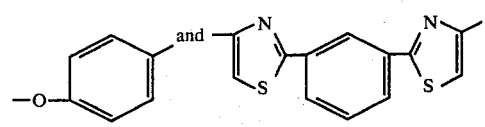

where Z, $Z^1$ and $Z^2$ are as defined above.
$R^2 =$

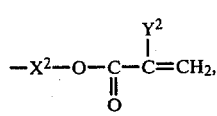

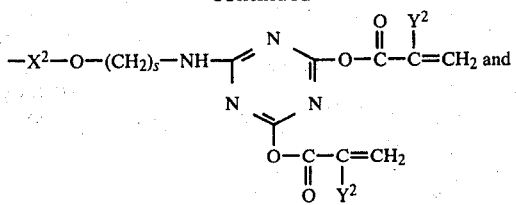

where s=2 to 16;
with the following applying to the further radicals:
$X^2 = -CH_2-$ and $-CH_2-O-[(CH_2)_r-O]_t(CH_2-)_s-$, and
$Y^2 = -H, -CH_3, -Cl, -Br, -C\equiv N$,
where r=2 to 18, s=2 to 16 and t=0 to 10.
$R^3 =$

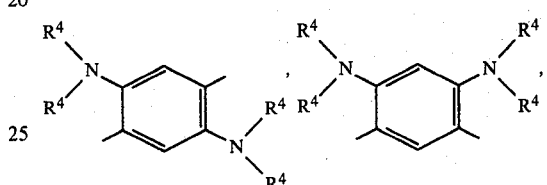

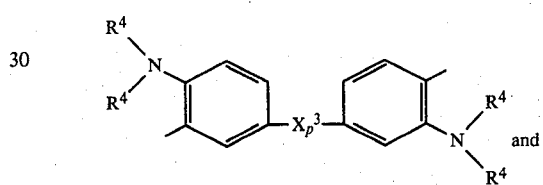

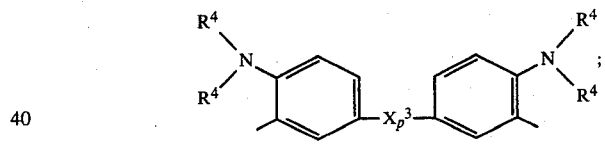

where p=0 or 1, and $X^3$ has the meaning given above for $X^1$;
$R^4 = H$ and

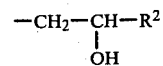

with the meaning for $R^2$ as given above.

The polymer precursor stages according to the present invention are addition products of olefinically unsaturated monoepoxides on amino group-containing prepolymers. These prepolymers are:

Polycondensation products of aromatic and/or heterocyclic tetraamino compounds with dicarboxylic-acid chlorides or esters (polyimidazoleprepolymers); and Polyaddition products of aromatic and/or heterocyclic tetraamino compounds and tetracarboxylic-acid dianhydrides (polyimidazopyrrolone prepolymers).

With respect to the preparation of polyimidazole prepolymers, the nature of the polycondensation reaction is such that, for a given tetraamino compound and a given dicarboxylic acid, the same polycondensation product will result regardless of whether the dicarboxylic acid is employed in the form of its chloride or its ester and regardless of the nature of the ester moiety per se. In turn, for a given olefinically unsaturated monoepoxide, a given tetraamino compound and a given dicarboxylic acid, reacted in the sequence according to this invention, the same polyimidazole prepolymer will be prepared regardless of whether the dicarboxylic acid is employed in the form of its chloride or ester, and regardless of the nature of the ester moiety per se.

The preferred tetraamino compound is diaminobenzidine; the preferred dicarboxylic-acid derivative is isophthalic-acid dianhydride; and the preferred tetracarboxylic-acid dianhydride is pyromellitic-acid dianhydride.

To the mentioned amino group-containing prepolymers which in the case of polyimidazopyrrolones also contain carboxyl groups, are added olefinically unsaturated monoepoxides. These epoxides have the following structure (5), where the unsaturated radical $R^2$ has the meaning given above:

$$H_2C\underset{O}{\overset{}{\diagdown\diagup}}CH-R^2 \tag{5}$$

Preferred are the unsaturated epoxides glycidyl acrylate and glycidyl methacrylate.

The structure of the precursor stages according to the present invention is illustrated by means of the following formulas (6) and (7):

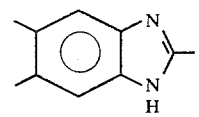

Polyimidazole

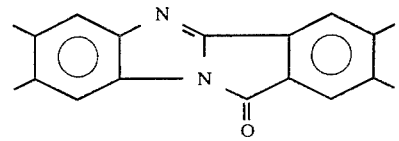

Polyimidazopyrrolone

The polyimidazole and polyimidazopyrrolone precursor stages according to the present invention are advantageously prepared in such a manner that an aromatic and/or heterocyclic tetraamino compound is reacted with a dicarboxylic-acid chloride or ester, or with a tetracarboxylic-acid dianhydride to form an amino group-containing reaction product, and that the reaction product is brought to reaction at room temperature or at temperatures of up to about 100° C. with an olefinically unsaturated monoepoxide in an organic solvent.

This method has the advantage that the preparation is simple, reaction temperatures of about 50° to 60° C. being generally sufficient, i.e., temperatures at which no

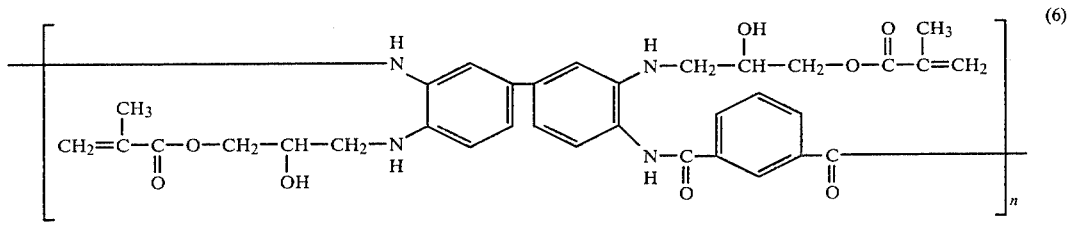

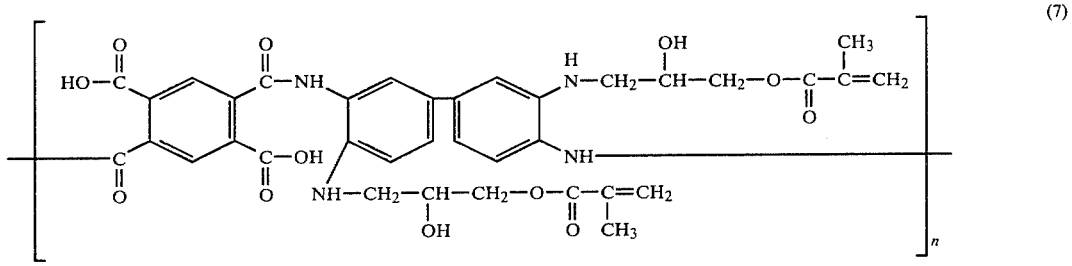

In Formula (6), a radiation-reactive polyimidazole precursor stage is shown, and more specifically, the addition product of glycidyl methacrylate on the polycondensation product of diamino benzidine and isophthalic-acid dimethyl ester. Formula (7) shows the addition product of glycidyl methacrylate on the polyaddition product of diaminobenzidine and pyromellithic-acid dianhydride, i.e., a polyimidazopyrrolone precursor stage.

The precusor stages according to the present invention have as basic building blocks preferably aromatic amino compounds and thus result, after their exposure to irradiation and, optionally, subsequent thermal treatment (annealing), in polymers with the structural unit (8) or (9)

conversion of the precursor stages into insoluble cyclization products as yet takes place. The end products are produced in pure condition, and no premature thermal cross-linking of the precursor stages takes place.

If excess amounts of epoxide are used, polyimidazopyrrolone precursor stages which are insoluble in aqueous alkaline solution are produced in the reaction of polyaddition products of tetraamino compounds and tetracarboxylic-acid dianhydrides with monoepoxides, since the free carboxyl groups of the prepolymer also react with the epoxide. Advantageously, however, a smaller amount of epoxide is utilized, i.e., an excess of the polyaddition product, such that, in this case, the precursor stage is soluble in aqueous-alkaline solutions due to the presence of carboxyl groups.

Besides use as a photo resist and for preparing protective and insulating films, where structuring is performed, the precursor stages according to the present invention can also serve for the manufacture of protective and insulating coatings generally, in non-structured form. These precursor stages can be used to particular advantage for the preparation of plastic coatings for the optical fibers of light waveguides.

DETAILED DESCRIPTION OF THE INVENTION

The invention is explained in greater detail with the aid of the following, non-limiting embodiment examples.

Example I

Preparation of a Radiation-Reactive Polybenzimidazole Precursor Stage 10.7 parts by weight 3,3'-diaminobenzidine are dissolved in 95 parts by volume N-methylpyrrolidone and are heated, together with 9.7 parts by weight isophthalic-acid dimethylester for 8 hours to a temperature of 150° to 175° C. and subsequently for 2 days to about 185° C. To this solution are added 20 parts by volume glycidyl methacrylate. After a reaction period of 48 hours at room temperature and 4 hours at about 50° to 60° C., the precursor stage is precipitated with 800 parts by volume isopropanol, washed with ethanol and dried in a vacuum. The yellow-brown product obtained shows the bands at 950 and 1290 cm$^{-1}$ typical for the methacrylate grouping in the IR spectrum (film).

Example II

Preparation of a Polyimidazopyrrolone Precursor Stage Soluble In An Aqueous-Alkaline Solution In a reaction flask flushed with nitrogen, a solution of 21.4 parts by weight (0.1 mol) diaminobenzidine in 190 parts by volume dimethylacetamide is received. To this solution are first added quickly, while stirring vigorously, 190 parts by volume of a solution of 21.8 parts by weight pyromellitic-acid dianhydride (0.1 mole) in 195 parts by volume dimethylacetamide. The prepolymer solution obtained is stirred slowly for about 30 minutes, while it is cooling down to room temperature. Thereupon, the remainder of the pyromellitic-acid dianhydride solution is added dropwise. After this solution is added completely, the straw-yellowish prepolymer solution becomes slightly viscous. In this connection it is important that pure starting materials and solvents are used.

To 44 parts by volume of the prepolymer solution obtained in the manner described above, 15 parts by weight glycidyl methacrylate (0.1 mol) are added dropwise at room temperature while stirring. After about 30 minutes, the reaction solution is heated for 12 hours to about 50° to 60° C., then allowed to cool to room temperature and left standing for 48 hours. Subsequently, the solution is added dropwise to 1000 parts by volume isopropanol while stirring vigorously. A yellow-brown substance is precipitated in the process and is dried in a vacuum. The polyimidazopyrrolone precursor stage obtained in this manner is soluble in aqueous-alkaline solvents and in polar organic solvents such as dimethylacetamide, dimethylformamide and N-methylpyrrolidone.

The IR spectrum, measured on a film, shows typical bands at 950 and 1290 cm$^{-1}$ (methylacrylate bands), at 1720 cm$^{-1}$ (ester band) and at 1670 cm$^{-1}$ (absorption band of secondary amides). The presence of carboxyl groups is shown particularly by the solubility in aqueous-alkaline solvents.

Example III

Preparation of a Polyimidazopyrrolone Precursor Stage Insoluble In An Aqueous-Alkaline Solution To 45 parts by volume of the prepolymer solution according to Example II, 50 parts by weight glycidyl methacrylate (0.35 mol) are added dropwise at room temperature while stirring vigorously. After a 2 hour reaction time, the temperature is raised to about 90° to 100° C. for 3 hours. The solution is then filtered and the resin is precipitated from 500 parts by volume ethanol. After drying in a vacuum, a brown powder is obtained which is no longer soluble in an aqueous-alkaline solution. This means that practically no free carboxyl groups are present; rather they have been esterified due to the use of a large excess of glycidyl methacrylate.

In comparison with the IR spectrum of a polyimidazopyrrolone precursor stage according to Example II, the present product shows a heavy reduction of the absorption in the region between 3000 and 3300 cm$^{-1}$ (lack of carboxyl groups). A distinct band is found at 3400 cm$^{-1}$, which can be ascribed to the OH-group. The structure of the reaction product is further indicated by the absorption bands at 950 and 1290 cm$^{-1}$ which can be assigned to the methacrylate grouping as well as by the ester band at 1720 cm$^{-1}$. The bands mentioned are not present in the IR spectrum of the corresponding prepolymer.

What is claimed is:

1. A polymeric polyimidazole precursor comprising the reaction product of (a) an olefinically unsaturated 1,2-monoepoxide and (b) an amino group-containing polycondensation product of (1) a member selected from the group consisting of an aromatic tetraamino compound and a heterocyclic tetraamino compound and (2) a member selected from the group consisting of a dicarboxylic acid chloride and an ester of a dicarboxylic acid.

2. The polyimidazole precursor according to claim 1 wherein the unsaturated monoepoxide is selected from the group consisting of glycidyl acrylate and glycidyl methacrylate.

3. The polyimidazole precursor according to claim 1 wherein said amino group-containing polycondensation product is the polycondensation product of diaminobenzidine and isophthalic-acid dimethyl ester.

4. A method for the preparation of a polyimidazole precursor comprising reacting (1) a member selected from the group consisting of an aromatic tetraamino compound and a heterocyclic tetraamino compound with (2) a member selected from the group consisting of a dicarboxylic acid chloride and an ester of a dicarboxylic acid to form an amino group-containing reaction product; and reacting said amino group-containing reaction product with an olefinically unsaturated 1,2-monoepoxide in an organic solvent at a temperature in the range of from about room temperature to a temperature of up to about 100° C.

5. A plastic coating for the optical fibers of a light waveguide comprised of the polyimidazole precursor of claim 1.

* * * * *